United States Patent
Xue et al.

(10) Patent No.: US 8,716,069 B2
(45) Date of Patent: May 6, 2014

(54) SEMICONDUCTOR DEVICE EMPLOYING ALUMINUM ALLOY LEAD-FRAME WITH ANODIZED ALUMINUM

(71) Applicants: Yan Xun Xue, Los Gatos, CA (US);
Yueh-Se Ho, Sunnyvale, CA (US);
Yongping Ding, San Jose, CA (US)

(72) Inventors: Yan Xun Xue, Los Gatos, CA (US);
Yueh-Se Ho, Sunnyvale, CA (US);
Yongping Ding, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/631,471

(22) Filed: Sep. 28, 2012

(65) Prior Publication Data
US 2014/0091446 A1 Apr. 3, 2014

(51) Int. Cl.
*H01L 21/00* (2006.01)
*H01R 43/00* (2006.01)
*H01L 23/495* (2006.01)
*H05K 5/02* (2006.01)

(52) U.S. Cl.
USPC ............... 438/123; 29/827; 29/856; 257/672; 257/676; 257/691; 257/693; 257/E23.031; 257/E23.042; 257/E23.052; 257/E23.053; 257/E23.054; 361/813

(58) Field of Classification Search
None
See application file for complete search history.

(56) References Cited

U.S. PATENT DOCUMENTS

| | | | |
|---|---|---|---|
| 5,449,951 A * | 9/1995 | Parthasarathi et al. | 257/677 |
| 6,420,779 B1 * | 7/2002 | Sharma et al. | 257/666 |
| 6,700,188 B2 * | 3/2004 | Lin | 257/684 |
| 6,861,295 B2 * | 3/2005 | Jung et al. | 438/124 |
| 6,953,986 B2 * | 10/2005 | Abbott et al. | 257/666 |
| 7,245,007 B1 * | 7/2007 | Foster | 257/678 |
| 7,413,934 B2 * | 8/2008 | Tellkamp | 438/123 |
| 7,788,800 B2 * | 9/2010 | Abbott | 29/827 |
| 2011/0079888 A1 * | 4/2011 | Bathan et al. | 257/676 |

\* cited by examiner

*Primary Examiner* — Alonzo Chambliss
(74) *Attorney, Agent, or Firm* — Chein-Hwa Tsao; CHEmily LLC

(57) ABSTRACT

A semiconductor device comprises an aluminum alloy lead-frame with a passivation layer covering an exposed portion of the aluminum alloy lead-frame. Since aluminum alloy is a low-cost material, and its hardness and flexibility are suitable for deformation process, such as punching, bending, molding and the like, aluminum alloy lead frame is suitable for mass production; furthermore, since its weight is much lower than copper or iron-nickel material, aluminum alloy lead frame is very convenient for the production of semiconductor devices.

9 Claims, 9 Drawing Sheets

US 8,716,069 B2

SEMICONDUCTOR DEVICE EMPLOYING ALUMINUM ALLOY LEAD-FRAME WITH ANODIZED ALUMINUM

FIELD OF THE INVENTION

The invention relates to a lead-frame in general, particularly, the invention aims at providing an aluminum alloy lead-frame with anodized aluminum applied in a power semiconductor device.

DESCRIPTION OF THE RELATED ART

As the power consumption of the traditional power semiconductor device is larger, smaller size and better heat dissipation are generally required. Most of the conventional lead-frames are made of an alloy, such as copper (Cu) alloy or iron-nickel (FeNi) alloy and the like, which requires an electrical isolation of the die paddle by fully encapsulating the die paddle with a molding compound. For example, in a semiconductor device 10, of TO220F package or TO262F package type, shown in FIG. 1A, a semiconductor chip and the die paddle, not the pins, of the lead-frame are fully encapsulated in a package body 18. However, the manufacturing process of this semiconductor device mode is more complicated and the thermal performance is not good. To improve the heat dissipation, as shown in semiconductor device 20, of T220 package type, as shown in FIG. 1B, the semiconductor chip and the front surface of the die paddle is encapsulated by the package body 28, but a bottom surface of die paddle of the lead frame 21 is exposed out of the package body 28 for heat dissipation. However, in a high voltage device, the exposed bottom surface of the die paddle of the lead-frame 21, which made of a Cu alloy or FeNi alloy, has negative impact on the other surrounded devices or leads to a serious risk of personal injury. In current technologies, the lead-frames are made of aluminum alloy. However, aluminum and aluminum alloy are easily oxidized in the air and the oxide layer formed on the surface of the aluminum alloy results in a difficulty in attaching a semiconductor chip on the lead-frame or in packaging the lead-frame.

It is within this context that embodiments of the present invention arise.

BRIEF DESCRIPTION OF THE DRAWINGS

As shown in attached drawings, the embodiment of the invention is more sufficiently described. However, the attached drawing is only used for explaining and illustrating rather than limiting the scope of the invention.

DETAILED DESCRIPTION OF THE PREFERRED EMBODIMENTS

Figure 1A:
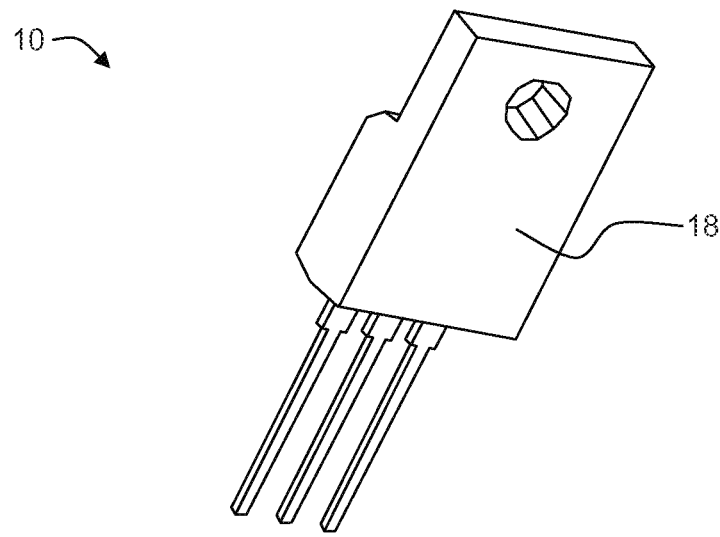
FIG. 1A is a perspective view of a conventional semiconductor device of TO220F or TO262F package.
Figure 1B:
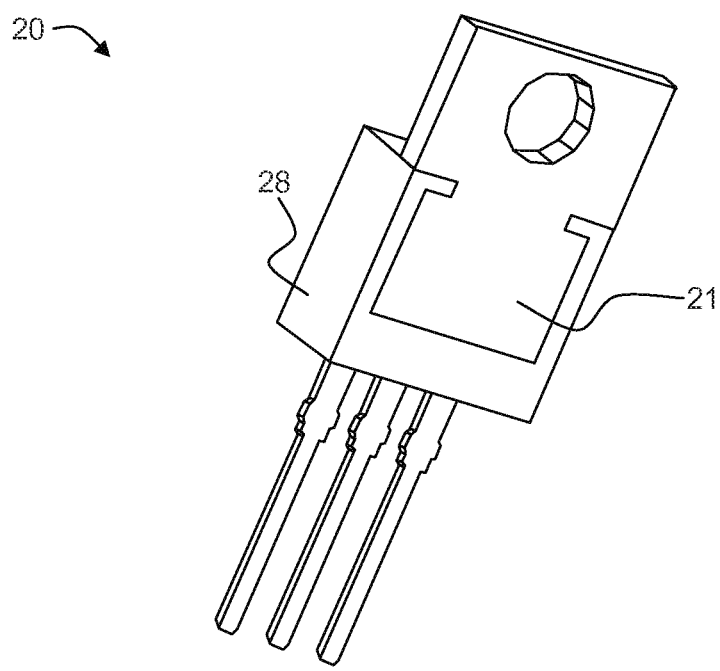
FIG. 1B is a perspective view of a conventional semiconductor device of TO220 package.
Figures 1, 2A:
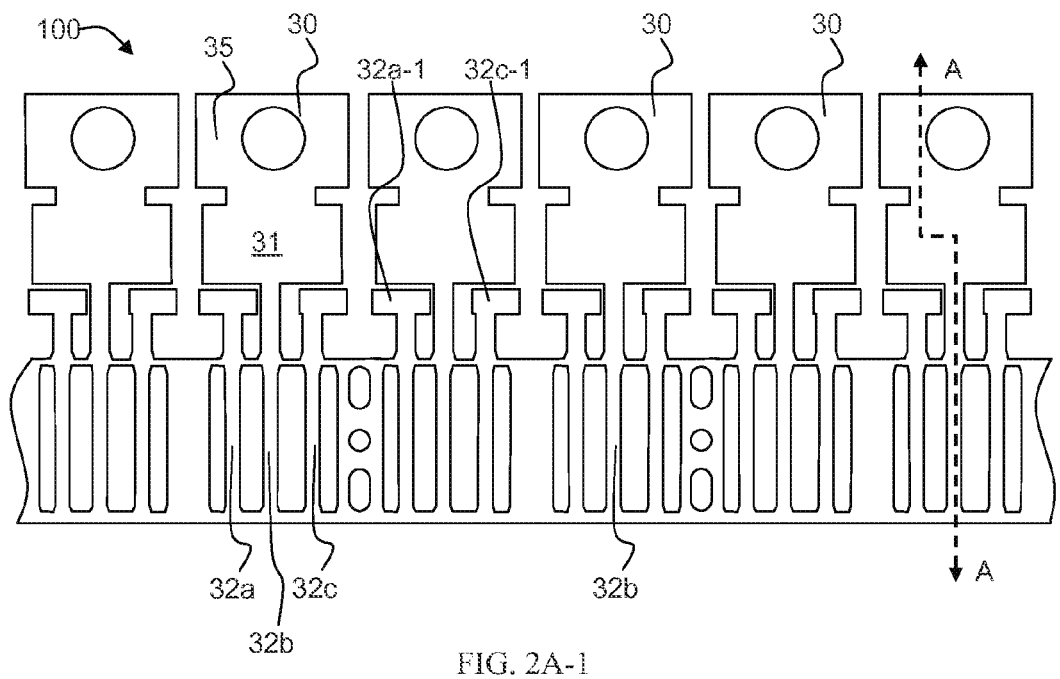
FIG. 2A-1, FIG. 2A-2, FIG. 2B, FIG. 2C, FIG. 2D, FIG. 2E, FIG. 2F, FIG. 2G, FIG. 2H, FIG. 2I, FIG. 2J, FIG. 2K, FIG. 2L are schematic diagrams illustrating a method of manufacturing a semiconductor device with a passivation layer covering the exposed portion of the aluminum alloy lead-frame.
Figures 2, 2A:
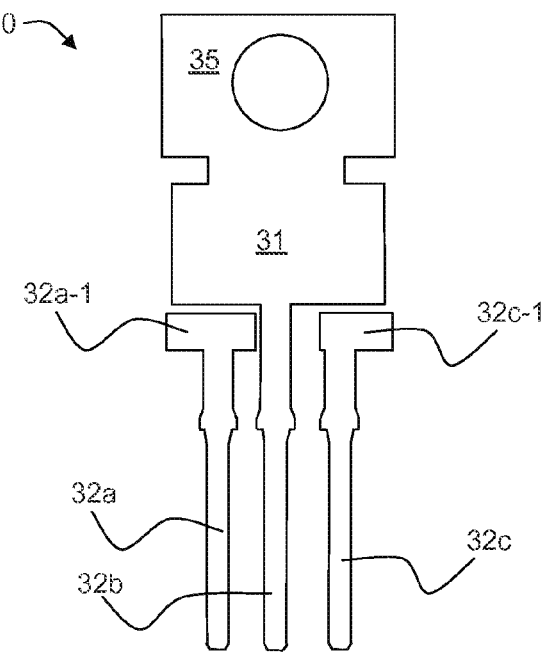

As shown in FIG. 2A-1, the lead-frame 100 made of aluminum alloy includes a plurality of chip mounting units 30, each of which includes a die paddle 31 for supporting a semiconductor chip and a plurality of pins 32a-32c arranged close to the die paddle 31. As shown in FIG. 2A-2, which is a schematic diagram of a single chip mounting unit 30, pins 32a and 32c are separated from the die paddle 31 and include bonding parts 32a-1 and 32c-1 respectively adjacent to the die paddle 31. Pin 32b is directly connected to the die paddle 31. The chip mounting unit 30 further includes a heat sink 35 including a through hole and connecting to the die paddle 31. The pins 32a-32c and the heat sink 35 are located at two opposite sides of the die paddle 31.

Figure 2B:
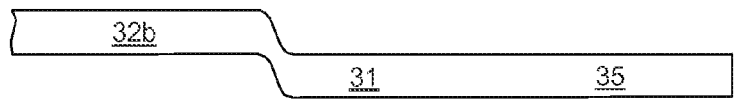
Figure 2C:
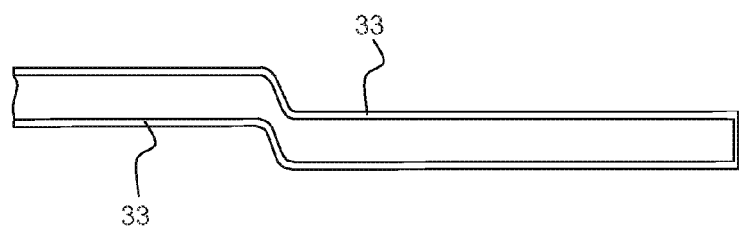

FIG. 2B is a cross-sectional schematic diagram of the chip mounting unit 30 along the dotted line A-A shown in FIG. 2A-1. In FIG. 2B-2C, a metal layer 33 is formed on the surface of the pins 32a-32c, the die paddle 31 and the heat sink 35 by electroplating, depositing, evaporating, sputtering or the like. There are a variety of choices for the structure and the material of the metal layer 33 with the wettability of the metal layer 33 being relatively good. The metal layer 33 can be a single layer structure of metal or a multi-layer structure (composite layer) formed by different metals. For example, the metal layer 33 can be made of Cu, Ni and the like, or of noble metals, such as Ag, Pd, Pt and the like, or of Ni/Pd/Au, Ni/Cu, Ni/Zn/Cu and the like.

Figure 2D:
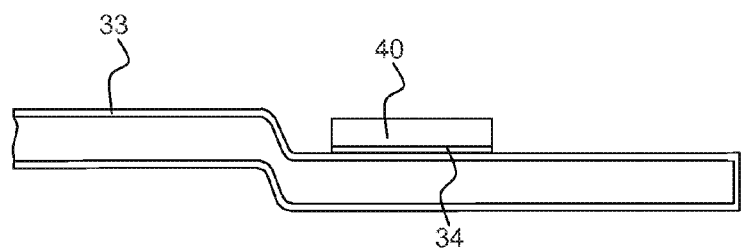
Figure 2E:
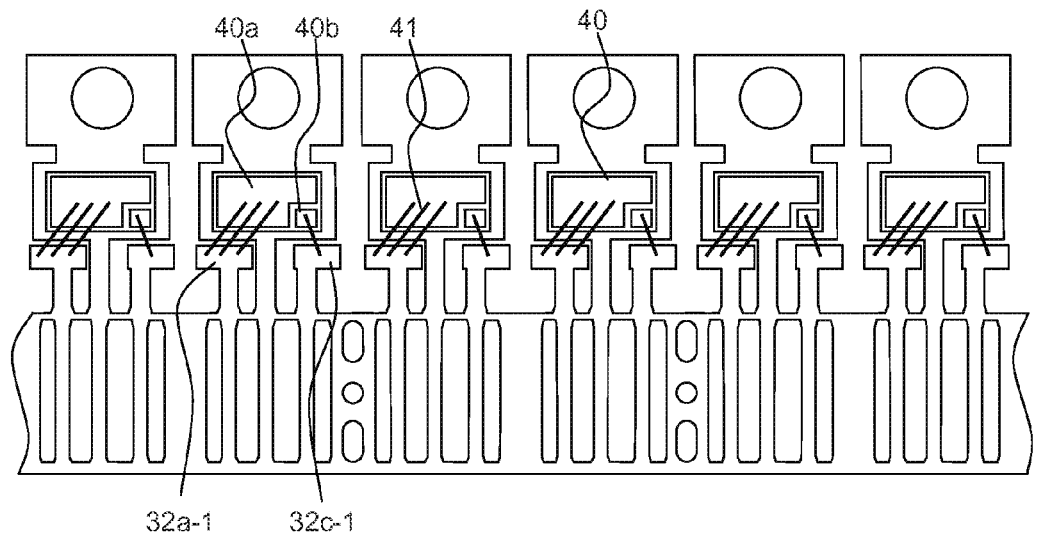

Then, as shown in FIGS. 2D-2E, a semiconductor chip 40 is attached on the front surface of each die paddle 31. The semiconductor chip 40 can be a vertical power device, in which the current flows from the front side to the backside of the device or vice versa. Therefore, a back metal layer (not shown) formed at the back surface of the semiconductor chip can be attached on the front side of the die paddle 31 through a conductive adhesive 34, such as silver conductive adhesive or solder paste and the like. In addition, the chip 40 can also be attached on the front side of the die paddle 31 through a eutectic die attach process.

In the chip mounting unit 30, the pins 32a-32c are arranged in parallel forming a row in a first plane, while the heat sink 35 and the die paddle 31 are connected together in a second plane with the first plane and the second plane forming a stepped structure. As shown in FIG. 2A-2, the bonding parts 32a-1 and 32c-1 have a large surface area, therefore, bonding pads 40a and 40b arranged at the front side of the chip 40 can be electrically connected to the bonding parts 32a-1 and 32c-1 through one or more interconnection structures 41, such as a bonding wire as shown in FIG. 2E or can be a metal sheet, a conductive band and the like.

Figure 2F:
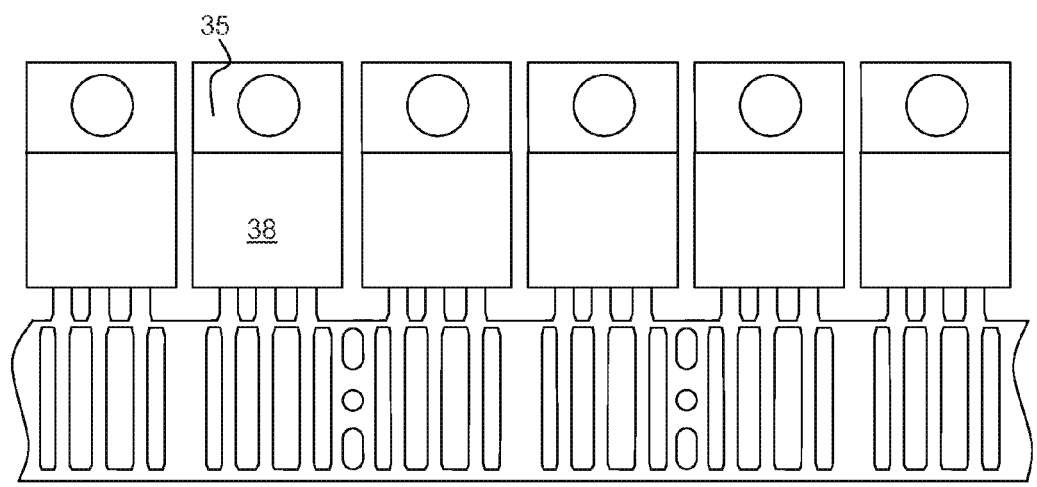
Figure 2G:
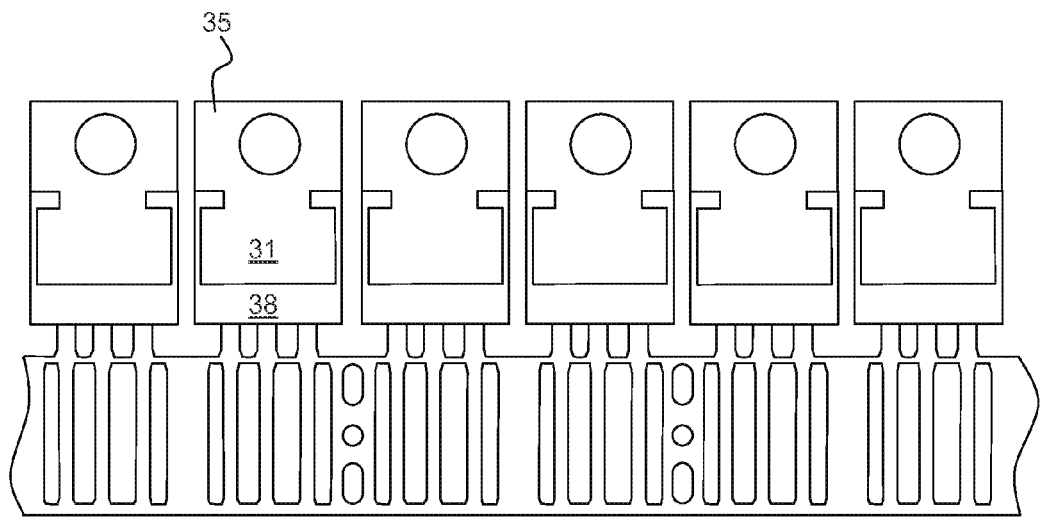
Figure 2H:
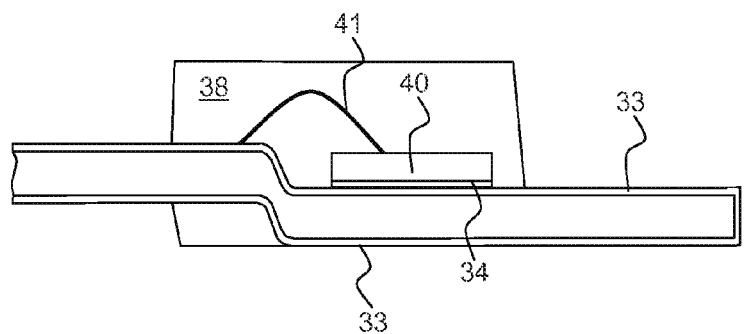

As shown in FIG. 2F, a plastic package body 38 is formed by a plastic material, for example epoxy resin, to cover the semiconductor chip 40, the interconnection structure 41, the bonding parts 32a-1 and 32c-1 of the pins 32a and 32c and a portion of the pin 32b. The plastic package body 38 only covers the front side of the die paddle 31, thus the metal layer 33 at the backside of the die paddle 31 and the surface of the heat sink 35 exposes out of the plastic package body 38 as shown in FIGS. 2G-2H for heat dissipation.

Figure 2I:
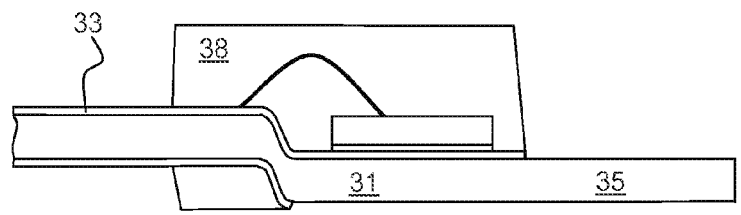

As shown in FIG. 2I, exposed portions of the metal layers 33 on the surface of the heat sink 35 and at the backside of the die paddle 31 are removed by a wet etching. The etching solution is selected corresponding to the materials of the metal layer 33, which cannot damage the plastic package body 38. In one embodiment, the whole heat sink 35 and the backside of the die paddle 31 are soaked in the etching solution in a etching container (not shown), where the metal layer 33 at the backside of the die paddle 31 and the metal layer 33 on the surface of the heat sink 35 are fully contacted with the etching solution, but the portions of the pins 32a-32c that are not covered by the plastic package body 38 must not be in contact with the etching solution. Thus, the metal layer 33 at the backside of the die paddle 31 and on the surface of the heat sink 35 are etched away, and the metal layer 33 on the surface of the portions of the pins 32a-32c not covered by the plastic package body 38 are still remained and used as anti-oxidation coating and a contact layer for electrically connecting to an external circuit. As a result, the back surface of the die paddle and the surface of the heat sink 35 expose to the air. As well known in the art, the exposed surface of aluminum is oxidized quickly forming a thin and porous oxide layer that reduces the reliability of the device. Therefore, the backside of the die paddle 31 and the surface of the heat sink 35 must be washed to eliminate the formation of the undesired oxide layers and other contaminants via metal degreasing, alkali etching, acid washing and neutralizing, and the like to obtain a clean surface of aluminum.

Figure 2J:
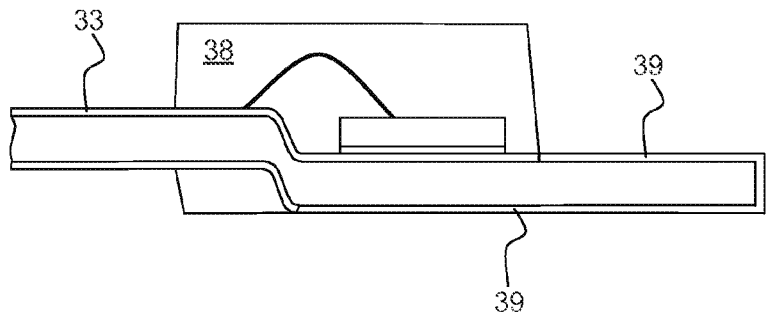

Then, as shown in FIG. 2J, a thick and dense anodic oxide layer 39, or a passivation layer 39, may be formed on the exposed aluminum at the backside of the die paddle 31 and on the surface of the heat sink 35 by the anodization of aluminum. For example, firstly, an electrolytic bath (not shown) is provided with electrolyte, such as acidic electrolyte, alkaline electrolyte, non-aqueous electrolyte and the like. The concentration and the chemical property of the electrolyte are adjusted to ensure that the electrolyte will not damage the plastic package body 38, such as low-concentration sulfuric acid $H_2SO_4$, auxiliary additives and the like. In this etching process, the whole surface of the heat sink 35 and the backside of the die paddle 31 are completely soaked in the electrolyte but portions of the pins 32a-32c not covered by the plastic package body 38 are completely stayed away from the electrolyte to prevent the metal layer 33 at these portions of the pins 32a-32c from being damaged by the electrolyte. The anodized aluminium layer is grown by passing a direct current through an electrolytic solution, with the die paddle 31 and the heat sink 35 (i.e., aluminum objects), after cleaning, serving as the anode. The current releases hydrogen at the cathode and oxygen at the surface of the aluminum anode, creating a build-up of aluminum oxide layer 39 at the backside of the die paddle 31 and on the surface of the heat sink 35. Under certain oxidizing condition, the oxidation film is a bilayer structure including a relatively thin but compact and imporous internal layer and a thick and porous external layer, wherein the internal layer is $Al_2O_3$ and the external layer is a porous layer formed due to reactions between the oxide film surface and water as well as chemical bonding adsorption of electrolysis anion. The passivation layer 39 terminates at the edge of the die paddle not covered by the plastic package body 38.

Figure 2K:
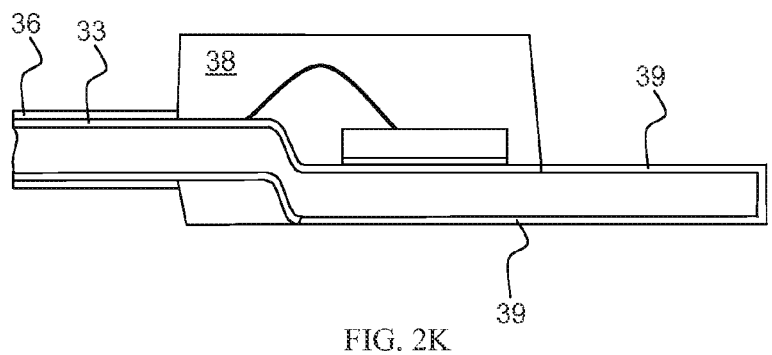
Figure 2L:
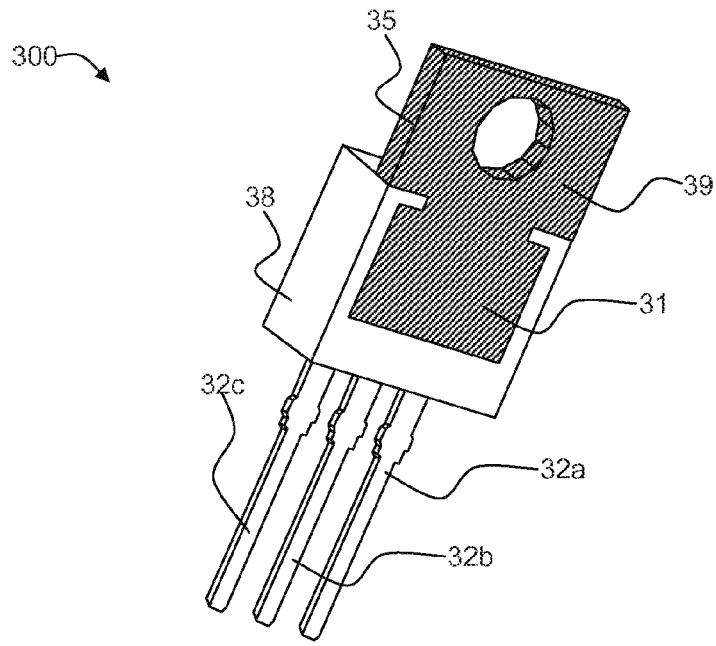

Then, the individual mounting units are separated from the lead-frame 100 and the pins 32a-32b are punched into designed shapes forming a plurality of individual semiconductor devices 300, one of which is shown in FIG. 2L. If the semiconductor chip 40 is a MOSFET (Metal-Oxide-Semiconductor Field Effect Transistor), the bonding pad 40b is a gate electrode, the bonding pad 40a is a source electrode and the back metal layer at the backside of the chip is a drain electrode. If the semiconductor chip 40 is an IGBT (Insulated Gate Bipolar Transistor), the bonding pads 40a and 40b and the back metal layer are the emitter, the base and the collector respectively. The shape and position of the bonding pads 40a and 40b of the semiconductor chip 40 shown in FIG. 2E does not limit the scope of the invention. In high-voltage power devices, the drain electrode (or collector), which is electrically connected to the die paddle 31, tends to have a larger voltage drop; therefore, if the backside of the die paddle 31 and the surface of the heat sink 35 directly exposed (i.e., without the passivation layer 39), there will be a potential safety risk and an interference to the other adjacent electronic components. As such, the passivation layer 39 electrically insulates the high voltage inside of the power device from the outside environment. In addition, the oxide layer 39 is not a thermally insulating material, it does not affect the heat dissipation performance of the die paddle 31 and heat sink 35.

In an alternative embodiment, as shown in FIG. 2K, an electroplating coating can be formed on the metal layer 33 at the surface of the portions of the pins 32a-32c that are not covered by the plastic package body 38. For example, when the metal layer 33 is not a noble metal or the outermost layer of the metal layer 33 does not include a noble metal layer, such as Ni/Cu or Ni/Zn/Cu and the like, the electroplating coating 36 is preferably formed on the metal layer 33. For example, electroplating coating of Sn is lower cost than using a noble metal. The electroplating coating 36 is preferably formed after the formation of the oxide layer 39 to avoid the absorption of Sn solder paste at the backside of the die paddle 31 or on the surface of the heat sink 35. Otherwise, if the metal layer 33 made of a noble metal layer, or when outermost layer of the metal layer 33 is a noble metal layer, it is unnecessary to form the electroplating coating 36.

Figure 3A:
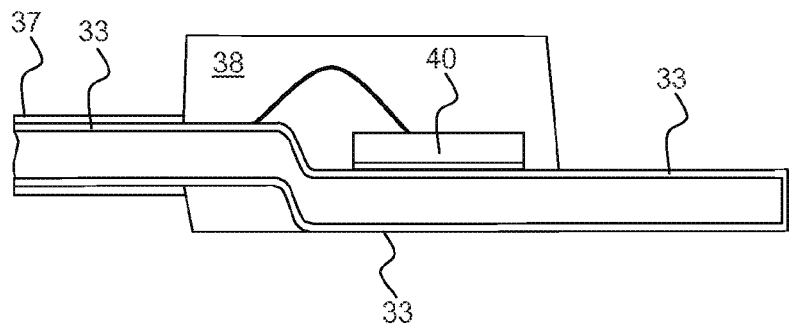
FIG. 3A, FIG. 3B, FIG. 3C are schematic diagrams illustrating the alternative method of manufacturing a semiconductor device with a passivation layer covering the exposed portion of the aluminum alloy lead-frame.
Figure 3B:
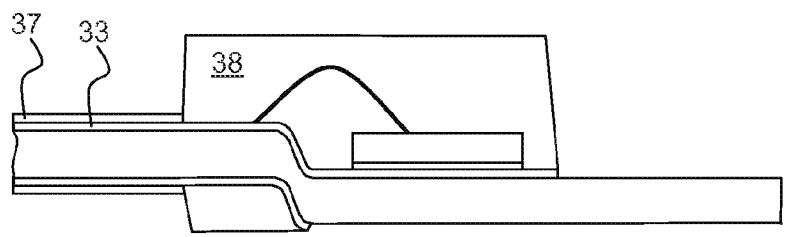
Figure 3C:
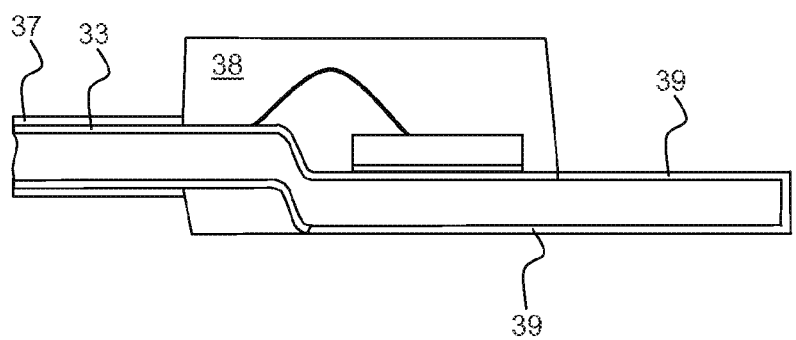

In a preferred embodiment, while the metal layer 33 at the backside of the die paddle 31 and on the surface of the heat sink 35 is being etched, the portions of the pins 32a-32c not covered by the plastic package body 38 may be not totally stayed away from being soaked in the etching solution and may be also etched; therefore, a resist layer 37 is preferably formed on the metal layer 33 on the surface of those portions of the pins 32a-32c, as shown in FIG. 3A, for protection the metal layer 33 at those portions from the etching solution. Generally, the resist layer 37 can be used as an etching stop (equivalent with one mask layer) if the etching solution used for etching the metal layer 33 will not damage the resist layer 37. For example, the metal layer 33 is a Ni/Cu composite layer and the resist layer 37 is a noble metal layer. The resist layer 37 can be removed or remained depending on the actual needs in the following step, for example, when the resist layer 37 is made of a noble metal as described above, it can be remained in the final product rather than being removed. As shown in FIG. 3B, the metal layer 33 at the backside of the die paddle 31 and on the surface of the heat sink 35 are etched while the metal layer 33 on the surface of the portions of the pins 32a-32c not covered by the plastic package body 38 cannot be etched. Then the oxide layer 39 is formed as shown in FIG. 3C.

Figure 4A:
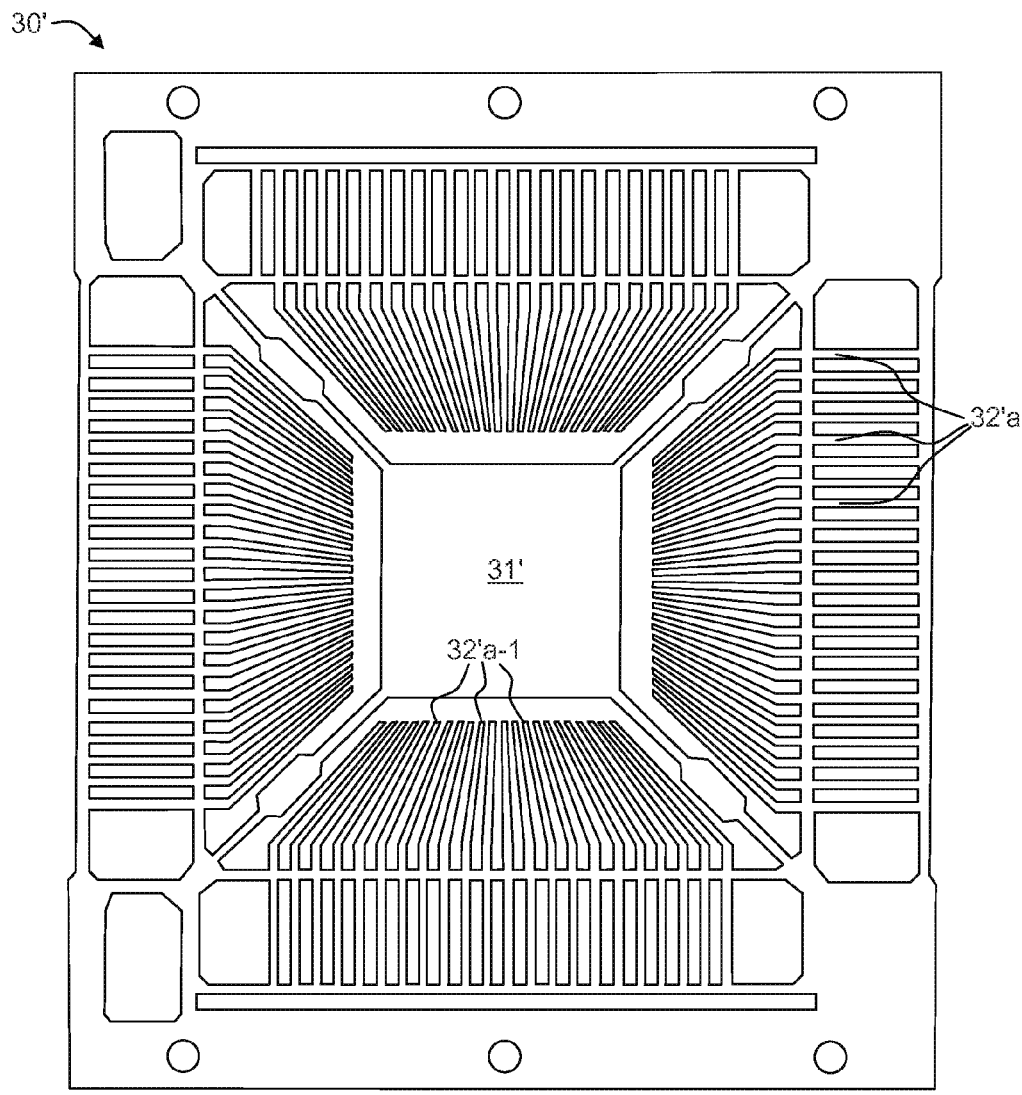
FIG. 4A, FIG. 4B, FIG. 4C, FIG. 4D, FIG. 4E are schematic diagrams illustrating another alternative method of manufacturing a semiconductor device with a passivation layer covering the exposed portion of the aluminum alloy lead-frame.
Figure 4B:
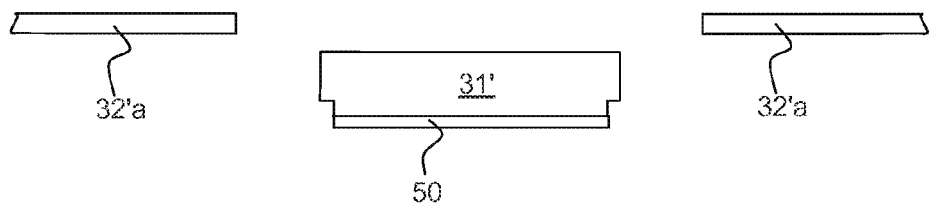
Figure 4C:
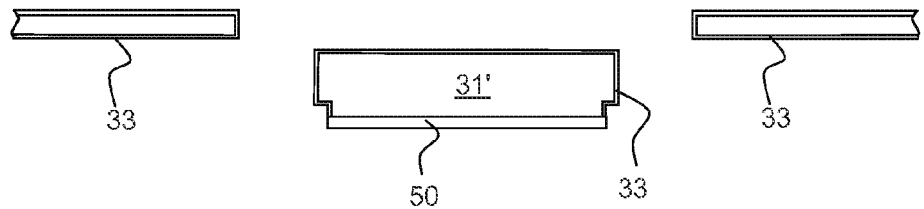
Figure 4D:
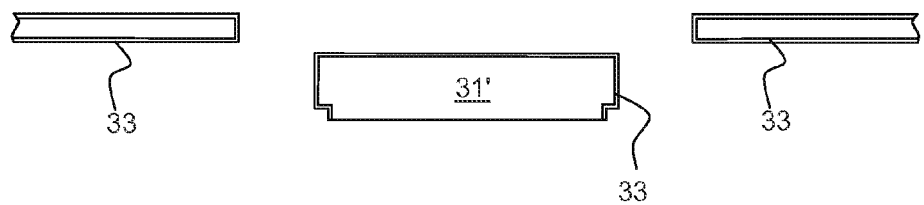
Figure 4E:
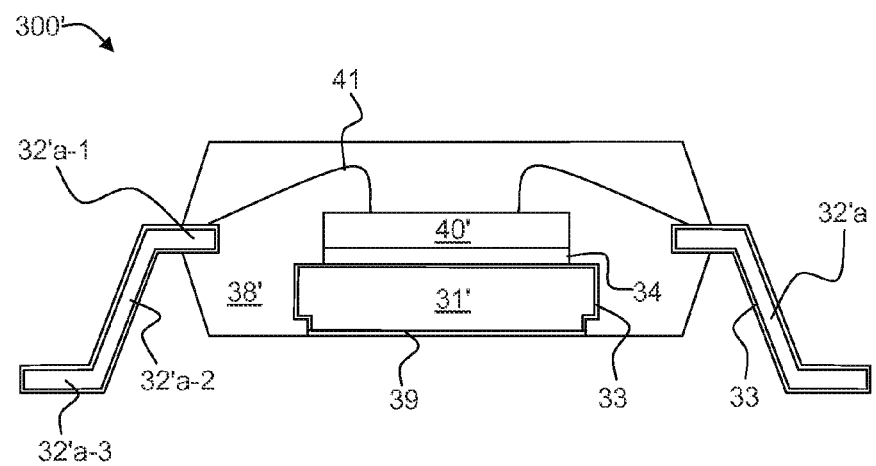

The scope of the present invention is illustrated in the above embodiments as the examples of the TO220 package, but it is not only limited to this type of package. In an alternative embodiment, as shown in FIG. 4A, a chip mounting unit 30' includes a plurality of pins 32'a arranged in the vicinity of the die paddle 31', surrounding the die paddle 31' and extend outside with the bonding part 32'a-1 being adjacent to the die paddle 31'. FIG. 4B is the side view of a chip mounting unit 30'. As shown in the figure, a cover film 50 is attached at the backside of each die paddle. As shown in FIG. 4C, one metal layer 33 is formed on the front side and sidewall of the die paddle 31' and the surface of the pin 32'a. Then, the cover film 50 is removed as shown in FIG. 4D, as such, there is no metal layer 33 forming at the backside of the die paddle 31'. Alternatively, the cover film 50 can be removed after the packaging step. As shown in FIG. 4E, a semiconductor chip 40' is attached at the front side of the die paddle 31' by an adhesive material 34, and the plurality bonding pads (not shown) at the front side of the chip 40' are connected to bonding parts 32'a-1 of the corresponding pins 32'a via the interconnection structure 41. A plastic packaging body 38' is then formed covering the front side and sidewall of the die paddle 31, the semiconductor chip 40', the interconnection structure 41 and covering a portion of the bonding part 32'a-1 that is connected to the bonding pads on the semiconductor chip via the interconnection structure 41. Therefore, the backside of the die paddle 31' exposes out of the plastic package body 38'. A thin passivation layer 39 is formed to cover the backside of the die paddle 31' right after the cover film 50 is removed, thus completing a semiconductor device 300' shown in FIG. 4E. The passivation layer 39 can be obtained at the backside of the die paddle 31' through the anodization of aluminum as described above.

In some embodiments, the types of the semiconductor chip 40' may be varied, for example, the semiconductor chip 40' does not include a back metal layer at its backside, or the back metal layer is formed at the backside of the semiconductor chip 40' but it is selected whether electrically connected to the die paddle 31' by applying an adhesive material 34 of conductive material or non-conductive material. In some embodiments, the pin 32'a is punched and formed a stepped structure including a higher end 32'a-1 served as the bonding part and a lower end 32'a-3 served as a contact part which are connected together by a connecting part 32'a-2, where the die paddle 31' is located in a higher plane than the lower end 32'a-3, as such, when the contact part 32'a-3 is attached on the bonding pad of the PCB (Printed Circuit Board), the backside of the die paddle 31' is not close to the PCB, thus improving the heat dissipation at the backside of the die paddle 31'.

In a preferred embodiment, the aluminum alloy material of the lead frame includes the weight percentage of the materials as follows substantially: 0.20%-0.6% of Si, 0.3%-0.8% of Fe, 0.1%-0.3% of Cu, 0.1%-1% of Mn, 0.5%-5% of Mg, 0.1%-0.5% of Cr, 0.1%-0.4% of Zn, 0.05%-0.3% of Ti, and the rest of Al and a very small amount of impurities.

In addition, in the step of forming the oxide layer 39, due to the high silicon content of the aluminum alloy is likely to cause silicon crystal to segregation, resulting in the difficulty in the formation and poor uniformity in thickness of the oxide film; therefore, Si content in the whole aluminum alloy should be proper, such as lower than 10% or even lower than 1.00%, so that the oxide layer 39 is formed more easily and the thickness uniformity of the oxide layer 39 is improved.

Since aluminum alloy is low-cost raw material and its hardness and the flexibility are suitable for deforming procedures required of punching, bending, forming and the like of the lead-frame, it is suitable for mass production; furthermore, since its weight is much lower than copper or iron-nickel material, aluminum alloy is a convenient material for the actual production.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A method of manufacturing a semiconductor device comprising:
   providing a lead-frame including a plurality of chip mounting units, each of which comprises at least a die paddle and a plurality of pins arranged close to the die paddle;
   forming a metal layer on the respective surface of the die paddle and the pins;
   attaching a semiconductor chip on a front side of the die paddle;
   electrically connecting each bonding pad arranged on a front side of the semiconductor chip to a bonding part of the corresponding pin close to the die paddle by an interconnection structure;
   forming a plastic package body covering the front side of the die paddle, the semiconductor chip, the interconnection structure and the bonding part of the pins, wherein the metal layer at the backside of the die paddle exposes out of the plastic package body;
   removing the metal layer at the backside of the die paddle; and
   forming a passivation layer at the backside of the die paddle.

2. The method of claim 1, wherein the metal layer at the backside of the die paddle is removed by wet etching, wherein the metal layer at the surface of a portion of the pin not covered by the plastic package body is not in contact with the etching solution to prevent it from being etched.

3. The method of claim 2, before removing the metal layer at the backside of the die paddle by wet etching, further comprising depositing a resist layer on the metal layer at the surface of the portion of the pin not covered by the plastic package body to protect the metal layer at this portion from the etching solution.

4. The method of claim 1, after forming the passivation layer at the backside of the die paddle, further comprising forming an electroplating coating on the metal layer at the surface of the portion of the pin not covered the plastic package body.

5. The method of claim 1, wherein the chip mounting unit further comprises a heat sink connecting to the die paddle, wherein the metal layer is also formed on the surface of the heat sink and the plastic package body does not cover the heat sink, therefore the metal layer on the surface of the heat sink is also removed when the metal layer at the backside of the die paddle is removed, and finally the passivation layer is also formed on the surface of the heat sink.

6. The method of claim 1, wherein the lead-frame is made of an aluminum alloy.

7. The method of claim 6, wherein the passivation layer is an aluminum oxide layer formed by anodization of aluminum.

8. A method of manufacturing a semiconductor device comprising:
   providing a lead-frame including a plurality of chip mounting units, each of which at least comprises a die paddle and a plurality of pins arranged close to the die paddle;
   forming a metal layer on a front side and sidewall of the die paddle and a surface of each pin;
   attaching a semiconductor chip on the front side of the die paddle;
   electrically connecting each bonding pad arranged on a front side of the semiconductor chip to a bonding part of a corresponding pin close to the substrate by an interconnection structure;
   forming a plastic package body covering the front side of the die paddle, the semiconductor chip, the interconnection structure and the bonding part, wherein the metal layer at the backside of the die paddle exposes out of the plastic package body is removed; and forming a passivation layer at the backside of the die paddle.

9. A method of manufacturing a semiconductor device including a die paddle for supporting a semiconductor chip and a plastic package body for covering the semiconductor chip and a portion of the die paddle comprising:
- exposing a backside of the die paddle out of the plastic package body: and
- forming a passivation layer at the backside of the die paddle.

\* \* \* \* \*